US007412361B2

(12) United States Patent
Rachlin

(10) Patent No.: US 7,412,361 B2
(45) Date of Patent: Aug. 12, 2008

(54) METHOD AND APPARATUS FOR PROGNOSTICATING PERFORMANCE OF A DYNAMIC SYSTEM INFLUENCED BY PLANNED HUMAN ACTIVITIES

(75) Inventor: Elliott H. Rachlin, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 813 days.

(21) Appl. No.: 10/446,288

(22) Filed: May 22, 2003

(65) Prior Publication Data

US 2004/0236563 A1 Nov. 25, 2004

(51) Int. Cl.
G06F 17/10 (2006.01)
(52) U.S. Cl. .......................................................... 703/2
(58) Field of Classification Search .................... 703/6, 703/2
See application file for complete search history.

(56) References Cited

U.S. PATENT DOCUMENTS

| 5,070,458 | A | 12/1991 | Gilmore et al. | |
| 6,122,572 | A | 9/2000 | Yavnai | |
| 6,684,182 | B1 * | 1/2004 | Gold et al. | 703/8 |
| 6,813,596 | B2 * | 11/2004 | Ellis et al. | 703/8 |

OTHER PUBLICATIONS

Carlos A. Liceaga, "SPASIM: A Spacecraft Simulator", 1997, Technical Report: NASA-97-isuac-cal, pp. 1-21.*
Alan Ptak and Khalil Foundy, "Real-time Spacecraft Simulation and Hardware-in-the-loop Testing", Proceedings of the 4th IEEE Real-time Technology and Applications Symposium, 1998, pp. 231-236.*

Ricki G. Ingalls et al.; "PERT scheduling with resources using qualitative simulation graphs", 2000, Proceedings of the 2000 Winter Simulation Conference, pp. 362-370.*
Russell Knight et al.; "Casper: Space Exploration through Continuous Planning", 2001, IEEE Intelligent Systems, vol. 16, No. 5; pp. 70-75.*
Steve Chien et al.; "Integrated Planning and Execution for Autonomous Spacecraft", 1999, Proceedings of the 1999 IEEE Aerospace Conference, pp. 263-271.*
J.W. Eun et al., "Architectural design of KOMPSAT mission control element", 1998, American Institute of Aeronautics and Astronautics Paper AIAA-98-1356, pp. 689-706.*
Zary Segall et al., "An Integrated Instrumentation Environment for Multiprocessors", Jan. 1983, vol. C-32, No. 1, pp. 4-14.*
Barney Pell et al., "Robust Periodic Planning and Execution for Autonomous Spacecraft", 1997, Proceedings of International Joint Conference on Artificial Intelligence, six unnumbered pages.*

(Continued)

Primary Examiner—Paul L Rodriguez
Assistant Examiner—Russ Guill
(74) Attorney, Agent, or Firm—Ingrassia, Fisher & Lorenz, P.C.

(57) ABSTRACT

Methods and apparatus are provided for prognosticating system performance in a dynamic system influenced by planned human activities the dynamic system comprising a telemetry subsystem. The apparatus comprises a processor coupled to the telemetry subsystem and configured to acquire data relating to the system state vector, a memory coupled to the processor, the memory containing mission plan data comprising information relating to said planned human activities influencing said dynamic system, and a dynamic system simulation core in said memory and executable on said processor to form a dynamic system simulation incorporating said mission plan data and said state vector data. The method includes parsing human activities into plannable elements.

40 Claims, 4 Drawing Sheets

OTHER PUBLICATIONS

Scott J. Landis et al., "Low Cost Satellite Ground Control Facility Design", Jun. 1993, IEEE Aerospace and Electronic Systems Magazine, vol. 8, Issue 6, pp. 35-49.*

Rolando L. Jordan et al., "The SIR-C/X-SAR Synthetic Aperture Radar System", Jun. 1991, Proceedings of the IEEE, vol. 79, No. 6, pp. 827-838.*

J. Kim et al., "CCSDS packet data processing of KOMPSAT MCE system", 1999, Communications APCC/OECC '99 Fifth Asia-Pacific Conference on . . . , vol. 1, pp. 781-785.*

Chang-Hee Won et al., "Mission Analysis and Planning System for Korea Multipurpose Satellite-I", Sep. 1999, ETRI Journal, vol. 21, No. 3, pp. 29-40.*

PCT International Search Report: PCT/US2004/016034, Applicant Reference No. H0004397.35611, Dec. 6, 2005, EP International Search Authority, 7 pages.

Pell, Barney et al., "Mission Operations with an Autonomous Agent," Aerospace Conference, 1998 IEEE Snowmass at Aspen, CO, USA Mar. 21-28, 1998, New York, NY, USA, IEEE, US, vol. 2, Mar. 21, 1998, pp. 289-313, XP010287127.

* cited by examiner

METHOD AND APPARATUS FOR PROGNOSTICATING PERFORMANCE OF A DYNAMIC SYSTEM INFLUENCED BY PLANNED HUMAN ACTIVITIES

FIELD OF THE INVENTION

The present invention generally relates to system simulation, and more particularly relates to prognosticating simulations that include the effects of planned human activities.

BACKGROUND OF THE INVENTION

Complex dynamic systems, such as the International Space Station, have a plurality of dynamic subsystems for providing electrical power, propulsion, life support, interior space utilization, communications bandwidth, attitude control, and orbital control, among others. The use of each subsystem is planned for by particular specialist groups for each subsystem who create hardcopy plans and assemble a master hardcopy plan. These plans sometimes create resource conflicts which are not noticed until they actually occur, potentially causing delays or loss of data. Deconflicting hardcopy plans has proven extremely complex.

Some simulations of dynamic systems are known. For example, simulating orbital motion, given initial position and velocity vectors, masses, and a starting time is accomplished based upon the laws of physics. For further example, simulating battery performance is known, given initial conditions and the equations of state for the battery. Equations of state calculate outputs from inputs. Human activities, such as changing the attitude of the spacecraft, thereby changing the air drag and thereby changing the orbit, may potentially be simulated. However, available simulations do not provide simulation of multiple simultaneous human activities or notices of resource conflicts within or between subsystem plans.

A principle difficulty in creating a simulation that incorporates multiple human activities affecting multiple subsystems is finding a common way to express the wide variety of human activities affecting the wide variety of subsystems. For example, a method for commonly expressing a spacecraft orbital maneuver, a change in battery loading for an on-board experiment, and a change in electrical supply resulting from the orbital maneuver's affects on the solar impingement angle on solar-voltaic arrays is not obvious.

Accordingly, it is desirable to develop a prognosticator in which the sum of many subsystem human activity plans may be incorporated with system and subsystem dynamics and the effects thereof simulated over a future period of time. It is further desirable to have the prognosticator identify future resource conflicts and provide an easy means for humans to propose resolution said conflicts, and then prognosticate the effects of that proposed resolution. It is further desirable to have the prognosticator identify future undesirable conditions, such as temperatures or flight parameters that exceed predetermined limits. It is further desirable to have the prognosticator identify deviations from a current plan and to incorporate those deviations into the prognostication. In addition, it is desirable to execute said prognosticator periodically, with a period that is preferably short compared to the period of prognostication. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

An apparatus is provided for prognosticating system performance of a dynamic system influenced by planned human activities. The apparatus comprises a processor coupled to a telemetry subsystem of the dynamic system and configured to acquire data relating to a system state vector, a memory coupled to a processor, mission plan data in said memory, the mission plan data comprising information relating to said planned human activities influencing said dynamic system, and a dynamic system simulation core in said memory and executable on said processor to form a dynamic system simulation incorporating said mission plan data and said state vector data.

A method is provided for prognosticating system performance of a dynamic system influenced by planned human activities. The method comprises parsing data relating to said planned human activities into mission data including a plurality of plannable elements, autocoding each plannable element into an executable plannable element, and coupling each said executable plannable element to an executable simulation core.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
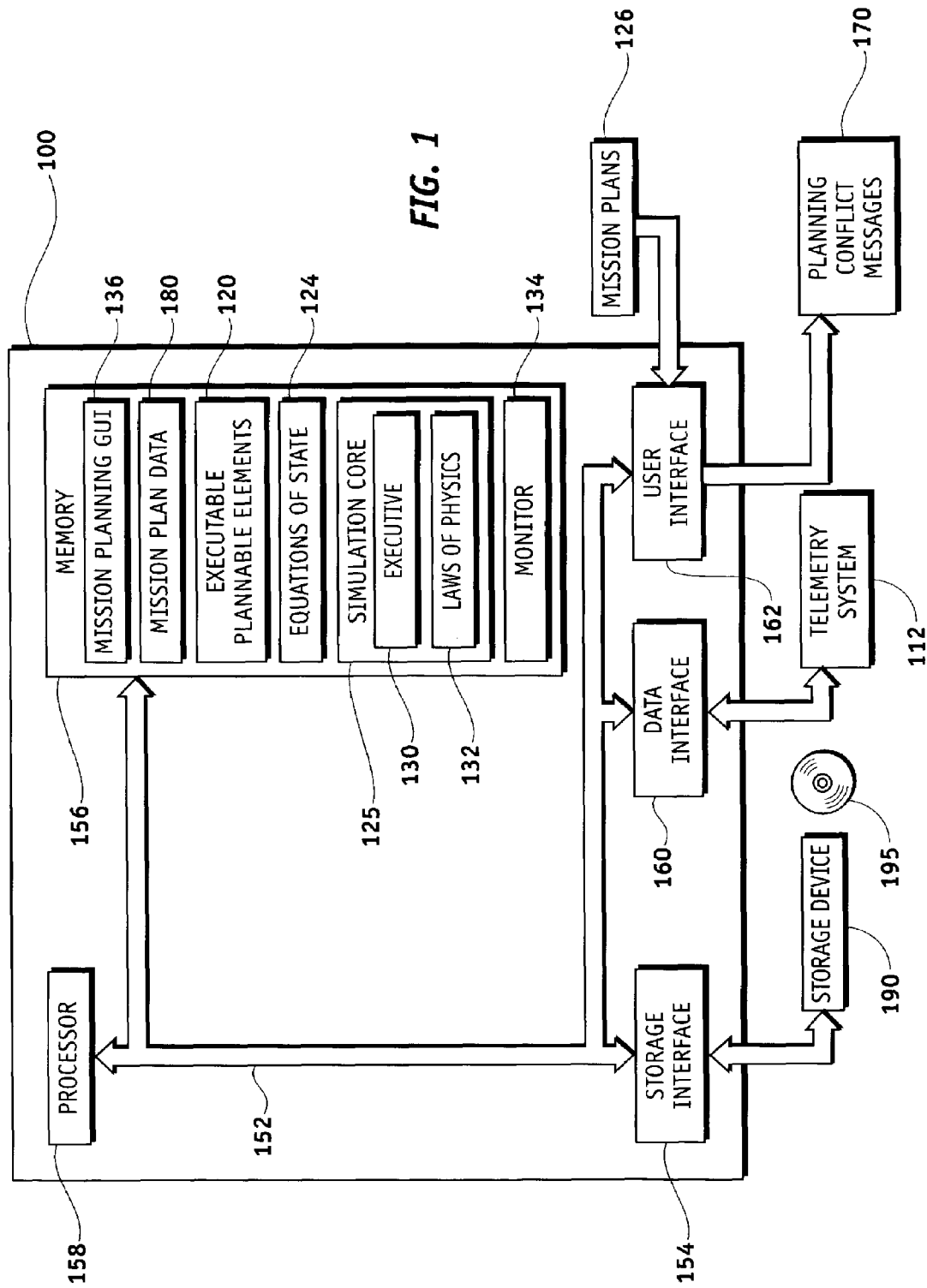
FIG. 1 illustrates an apparatus for prognosticating resource conflicts in a dynamic system influenced by human activities.

FIG. 1 shows an exemplary apparatus 100 for prognosticating system performance in a dynamic system influenced by planned human activities. The apparatus 100 includes a processor 158, communicatively linked to a memory 156, a storage interface 154, a data interface 160, and a user interface 162 by a bus 152. Memory 156 may contain a mission planning graphical user interface (GUI) 136, mission plan data 180, executable plannable elements 120, an equations of state 124 code module, a simulation core code module 125 and a monitoring code module 134.

Processor 158 may be a plurality of processors 158 which may be associated using networks and/or buses of any known type. Processor 158 may comprise a dedicated processor chip or any logical device of similar functionality, such as a dedicated logic circuit. The processor 158 is shown and described as electronic but may be magnetic, fluidic, optical, mechanical, or use any other medium known to be suitable for operating logical devices. Memory 156 may be a plurality of memory devices which may be associated using a networks and or buses of any known types. Memory 156 may include random access memory (RAM) of any known type, compact disk read-only memory (CD-ROM), memory cards, memory sticks, magnetic tape, laser disk, or similarly functional installed or removable devices. Memory 156 may be magnetic, fluidic, optical, mechanical, or use other known medium for data storage.

The simulation core 125 may include coded equations and data representing the laws of physics 132. For example, equations of orbital motion and data relating to the universal gravitational constant may be included for a dynamic system which comprises a spacecraft. In some embodiments, the laws of physics 132 may be outside of but accessible to the simulation core 125. For example, the laws of physics 132 may be a separate library of coded routines or objects which may be called when needed. The simulation core comprises a simulation executive 130 which controls the starting, stopping, and simulation time steps of a simulation. The simulation executive 130 may periodically restart the simulation to cover a predetermined future period of time, thereby producing a fixed-duration look-ahead capability for planners. The simulation may terminate at a particular time or on the occurrence of a particular condition relating to any variable or combination of variables in the simulation, as specified by the user.

In an alternate embodiment, the simulation core 125 may comprise all parts of a simulation except executable plannable elements 120. In another alternate embodiment, the simulation core 125 may comprise only the simulation executive 130. Those of ordinary skill in the art will know how to adapt the contents of the simulation core 125 to their specific applications.

Figure 3:
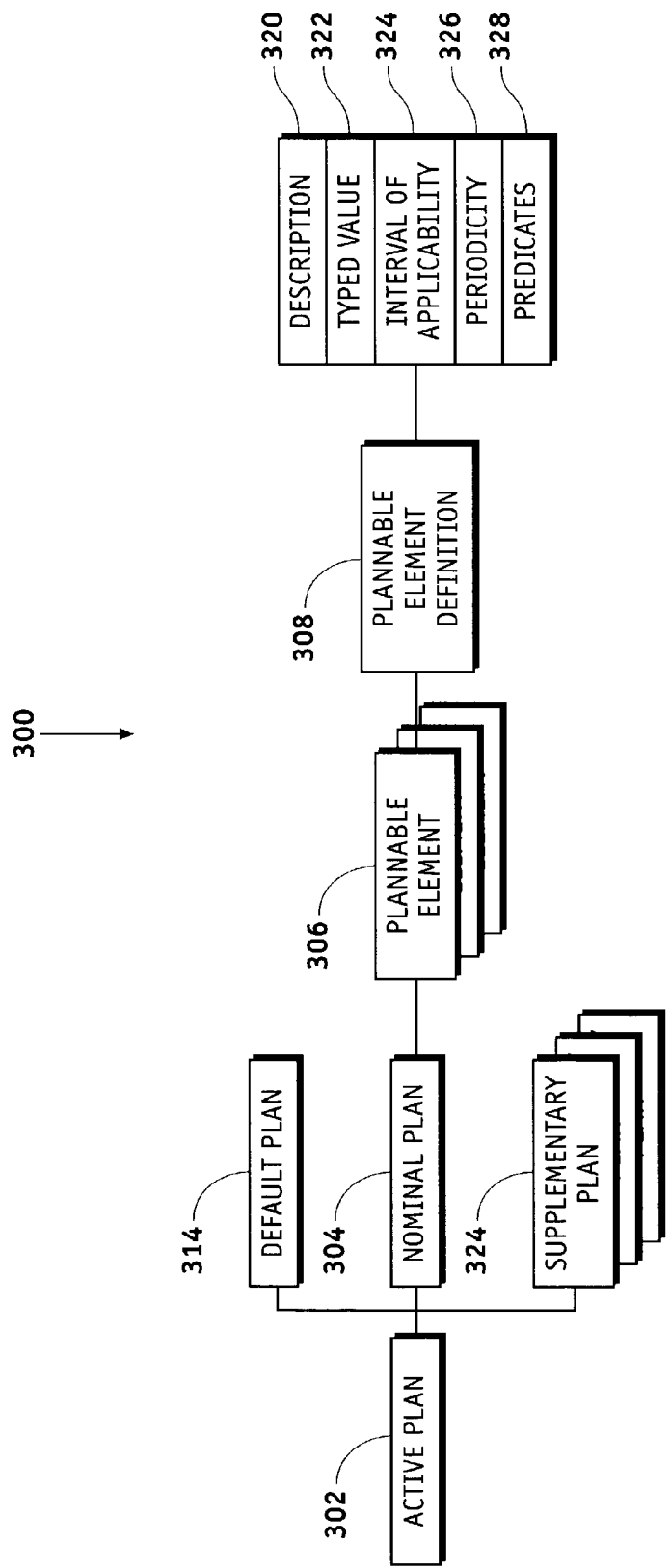
FIG. 3 shows a block diagram of a data structure for expressing human activity plans adapted to be processed with a simulation of a dynamic system.

The mission planning GUI 136 presents screen prompts to a user over user interface 162 to organize the entry of mission plan data 180 into memory 156. A sequence of screen prompts may be provided for each plannable element 306 (FIG. 3). The screen prompts rely upon list selections, radio buttons, and similar devices known in the art to limit the mission plan data 180 entered to data suitable for autocoding. Mission planning GUI 136 permits editing of mission plan data 180 and, when the mission plan data 180 for a particular plannable element 306 is complete, autocodes the mission plan data 180 into a particular executable plannable element 120. Mission planning GUI 136 may have an integral or accessible autocoding capability. The GUI 136 may present each autocoded plannable element 120 for user review after each is autocoded. In some embodiments, the autocoding may be done in a batch mode, wherein data for many plannable elements 306 may be first entered and then autocoded. Any computer language may used as a target language for the autocoder. Mathematica, from Wolfram Research, Inc., has proved useful as a target language for autocoding plannable elements 306.

Executable plannable elements 120 are expressions for changing a value of a variable representing an element of the simulated system state vector. The state vector is a grouping of variable parameters and constant parameters describing the dynamic system. The state vector may be maintained to any level of detail desired. The state vector comprises elements, with each element corresponding to a variable or constant in the simulation. A state vector of the actual dynamic system may be extracted from data supplied by the telemetry subsystem 112 to initialize the simulation state vector. In this way, the prognosticator looks ahead from the current actual state of the dynamic system. The executable plannable elements 120 may be executed using an interpreter or may be compiled. In many embodiments, the executable plannable elements 120 are expressed in a meta language such as Mathematica or MATLAB which may be interpreted or compiled.

FIG. 1 shows the code modules 136, 125, 134, 120, and 185 of the apparatus 100 in a single memory 156. Those of ordinary skill in the art will appreciate that multiple memories 156, processors 158, buses 152, interfaces 154, 160, and 162, and communications links not shown may be employed to create apparatus 100.

The autocoded executable plannable elements 120 are coupled to the simulation core 125, which may call each executable plannable element 120, in turn, for each time step of the simulation. Coupling may be accomplished by compiling together the executable plannable elements 120 and the simulation core 125. In some embodiments, the executable plannable elements 120 and the simulation core 125 may be written in an interpreted language and coupling may be accomplished by storing the executable plannable elements 120 in a file accessible to the simulation core 125. Executable plannable elements 120 may be adapted for coupling with a simulation core by any method known in the art including choice of language and choice of data structure in which the executable plannable elements 120 may be stored. Other methods of coupling should be obvious to those of ordinary skill in the art in light of this disclosure.

An executable plannable element 120 may return a value in a particular simulation step which has no effect on the simulation or may return a value changing, directly or indirectly, a value of one or more elements of the system state vector. In an alternate embodiment, the simulation core 125 may initially sort the calling order of the executable plannable elements 120 by time of next applicability so that less than all executable plannable elements 120 need to be called at each simulation time step. In a variation of the alternate embodiment, the simulation executive 130 may periodically re-sort the calling order of the executable plannable elements 120.

The equations of state 124 code comprises coded equations and data relating inputs to the system, subsystem, box, and component to the outputs thereof. As a general rule, the equations of state 124 are used to simulate man-made objects and the laws of physics are used to simulate natural objects and forces. Exceptions to the general rule are known to occur. The equations of state 124 code may be coupled to the simulation core 125. In many embodiments, the equations of state 124 code may be integral to the simulation core 125.

The telemetry subsystem 112 of the dynamic system to be prognosticated may be coupled to the processor 158 via data interface 160 and bus 152. A portion of the simulation core 125 executing on processor 158 may extract the system state vector from the telemetry subsystem. In an alternate embodiment, a separate body of code, accessible to the simulation core 125, may translate data from telemetry subsystem 112 to form a state vector. Extraction may include reading data, storing data, decommutating data, conditioning data, integrating some early data with respect to time in order to produce an entire initial state vector as of a certain point in time, and calculating derived quantities. The extraction produces an initial state vector as of a point in time for use by the simulation core 125. In most embodiments, the simulation core may be periodically restarted, so extraction of the next initial state vector may be substantially continuous: the time it takes to gather the state vector may be a limiting factor in how frequently the simulation may be restarted.

Any of the data 180 or code modules 185, 120, 124, 125, 130, 132, 134, and 136 may be stored in a storage device 190, which may include storage on any type of removable storage media 195. Only the portion of the code module or data immediately needed by processor 158 may be copied to memory 156 and/or processor 158.

The combination of the simulation core 125 coupled to the telemetry subsystem 112 and to the executable plannable elements 120 comprises a system simulation. Coupling equations of state code module 124 to the simulation core 125 improves the system simulation.

The monitor 134 receives data produced by the system simulation and may produce planning conflict messages 170 which include resource conflict messages, undesirable condition messages, and plan deviation responses. A resource conflict message may be generated when an executable plannable element 120 calls for a resource that is not available. For example, if an executable plannable element 120 will call for 11 amps of electrical power from a power bus that will have only 10 amps remaining at the time, a planning conflict message 170 will be sent to the user warning of the impending resource conflict. For example, the message "Aug. 21, 2004 5:52:5 (+3125) RPCM RPCM_LA2B-A' current limited to 10 amps (requested: 11 amps)," may be sent, showing the time at which the resource conflict begins. Planning conflict messages 170 may include additional data, such as a listing of power consumers on the power bus. In most embodiments, a resource deconfliction message 170 may also be produced by the monitor 134 when adequate resources are again available. In the example above, if a power consumer of 2 amps ceased operation, monitor 134 would produce a notice that full power was now available to component RPCM_LA2B-A. Those of ordinary skill in the art may appreciate, in light of this disclosure, the breadth of possibilities for useful data which may be included in resource conflict messages.

The monitor 134 may also produce an undesirable condition message, which may be sent when a parameter exceeds a predetermined tolerance. For example, if the altitude of the ISS will be lowered below a safe altitude by air drag and solar radiation pressure, monitor 134 will produce a planning conflict message 170 advising of the undesirable condition. A parameter may have multiple limits and tolerances. For example, an electronic component may have high and low temperature warning, or "yellow," limits and high and low critical, or "red," limits. The planning conflict message 170 advising of the undesirable condition may include details of which limit has been exceeded. Those of ordinary skill in the art may appreciate, in light of this disclosure, the breadth of possibilities for useful data which may be included in undesirable condition messages.

The monitor 134 may detect a deviation from a current plan and issue a plan deviation response. The plan deviation response incorporates the plan deviation into the system simulation. For example, at a point in time where the system simulation starts, the plan may call for a particular hatch to initially be open, and the telemetry subsystem 112 may be indicating that the hatch is actually closed. The plan deviation response may change the mission plan data 180 to incorporate the fact that the hatch is closed at the beginning time of the simulation. The change may be implemented by changing a variable within the mission plan data 180. In an alternate embodiment, the change may be made in the executable plannable element 120. The plan deviation response may also advise a user of the change.

In some embodiments, the apparatus 100 may be a prognostic element in an integrated vehicle management system (IVHMS). In such embodiments, telemetry subsystem 112 may be linked to data interface 160 through the IVHMS and planning conflict messages 170 are sent to the IVHMS. Plan deviation responses may be implemented by the IVHMS. In a some alternate embodiments, the IVHMS automatically deconflicts resources and avoids undesirable conditions according to a priority scheme. In other embodiments, deconfliction occurs manually, through entering at least a portion of a new mission plan 126 through user interface 162.

Figure 2:
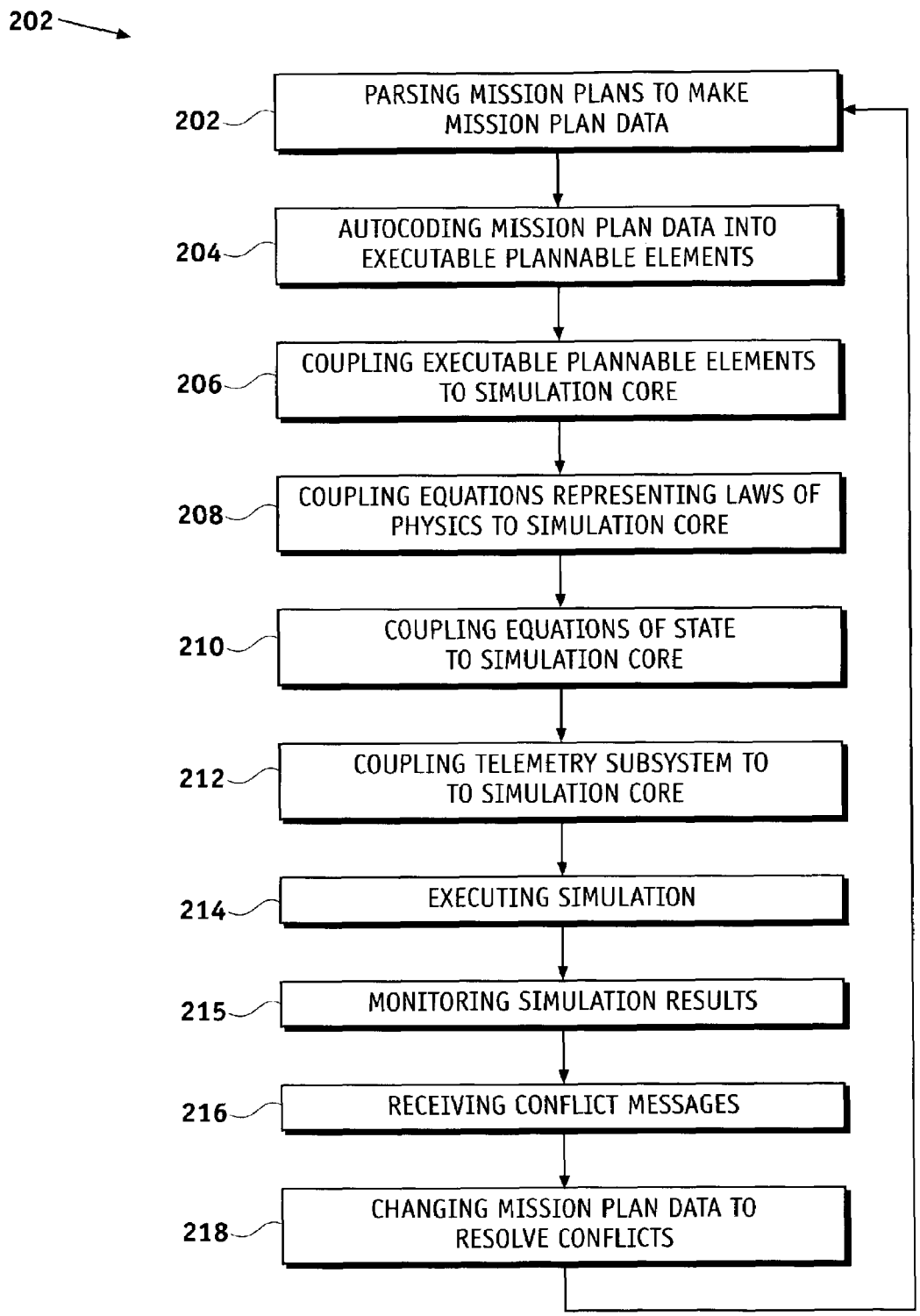
FIG. 2 illustrates a method for prognosticating resource conflicts in a dynamic system influenced by human activities.

FIG. 2 shows an exemplary process 200 for prognosticating system performance of a dynamic system affected by planned human activities. In step 202, mission plan data 180 may be entered into the apparatus 100 via user interface 162 and bus 152 using mission planning GUI 134. In some embodiments, the mission plan data 180 may be entered directly into a text file using a text editor. Entering mission planning data 202 includes parsing human activities into plannable elements 306 (FIG. 3). Using mission planning GUI 134 assists with the parsing by requiring each human activity in the mission plan 126 to be entered as plannable elements 306 (FIG. 3). Each plannable element 306 relates to one state vector element or quantity affecting a state vector element. GUI 134 further assists with parsing by requiring each plannable element 306 to be entered as parsed segments including description 320, typed value 322, interval of applicability 324, periodicity 326, and predicate expression 328. The GUI 134 may be designed such that the context of an input provides useful information to an autocoder.

Data entry includes editing entries. In some embodiments, data entry may be from a separately formed data file, perhaps on removable media 195. In some of those embodiments, the data file may have been formed by parsing a mission planning document text file for the hardcopy mission plan using known methods such as PEARL scripts. In a few embodiments, the parsed data may be loaded into the mission planning GUI 134 input windows for review by a user.

FIG. 3 shows that mission plans 126 have structure 300. Active plan 302 may be comprised of nominal, or currently executing plan 304, a default, hard-coded plan 314, and supplementary plans 324 which may be added to or substituted for nominal plan 304. Each nominal plan 304, default plan 314, and supplementary plan 324 comprises plannable elements 306 having a plannable element definition 308 further having portions for a description 320, a typed value 322, an interval of applicability 324, periodicity information 326, and predicate expressions 328. Except for the description 320, the portions of each plannable element 306 may be autocoded into an executable plannable element 120. Description 320 may be for the convenience of the human user. The list of portions 320, 322, 324, 326, and 328 is exemplary: additional and alternate parsed portions are contemplated within the scope of the present invention.

Each plannable element 306 relates to a change in at least one element of the system state vector. For example, one plannable element 306 may be to change the Boolean value of "space shuttle docked" as of a planned time. The element of the system state vector may be a composite element, such as a velocity vector. The element of the system state vector may be generally instantiated as a variable in a telemetry data stream, a code module, or both. Changing a value 322 of one element of a system state vector, such as power used by box A, may change other elements of the system state vector such as power used by boxes B, C, and D. Any change in a value 322 directly representing resource usage may change many system state vector elements.

The typed value 322 comprises a type, such as real, integer, or Boolean and a value of that type such as "49.7," "3," or ".TRUE.", respectively. The value of typed value 322 represents a new value which may be assigned to a state vector element, or variable, or to a quantity that affects a variable, at the beginning of an interval of applicability 324. Typed value 322 may an expression of virtually any complexity which resolves to a value 322 of the associated type 322.

The interval of applicability 324 usually comprises at least one date and time which may be a start time or an end time. The interval of applicability may be entered in a mission data GUI 134 window having associated radio buttons for different intervals of applicability such as "after time," "between times," "after event," "during condition," and similar restrictions. One purpose for the mission planning GUI 134 may be to restrict the entry of data to data suitable for autocoding and radio buttons, menus, and the like may be used to that purpose.

A value 322 for an element of the system state vector or a quantity that affects variables may be changed periodically using the periodicity 326 portion of the plannable element definition 308. Mission planning GUI 134 may provide a plurality of windows indicating a temporal sequence to simplify inputs of periodicity 326 data. Some plannable elements 306 may not be periodic.

Predicate expressions 328 evaluate conditions that must exist before the value of the variable or quantity affecting a variable changes. Such conditions may include, for example, spacecraft attitude, mode, or eclipse condition. A predicate expression 328 may be of any complexity and may evaluate to a Boolean value. Some plannable elements 306 may not have predicate expressions 328.

FIG. 2 shows that, once the data 320, 322, 324, 326, and 328 has been entered for plannable elements 306 to create mission plan data 180, the mission plan data 180 may be autocoded 204 into executable plannable elements 120.

Figure 4:
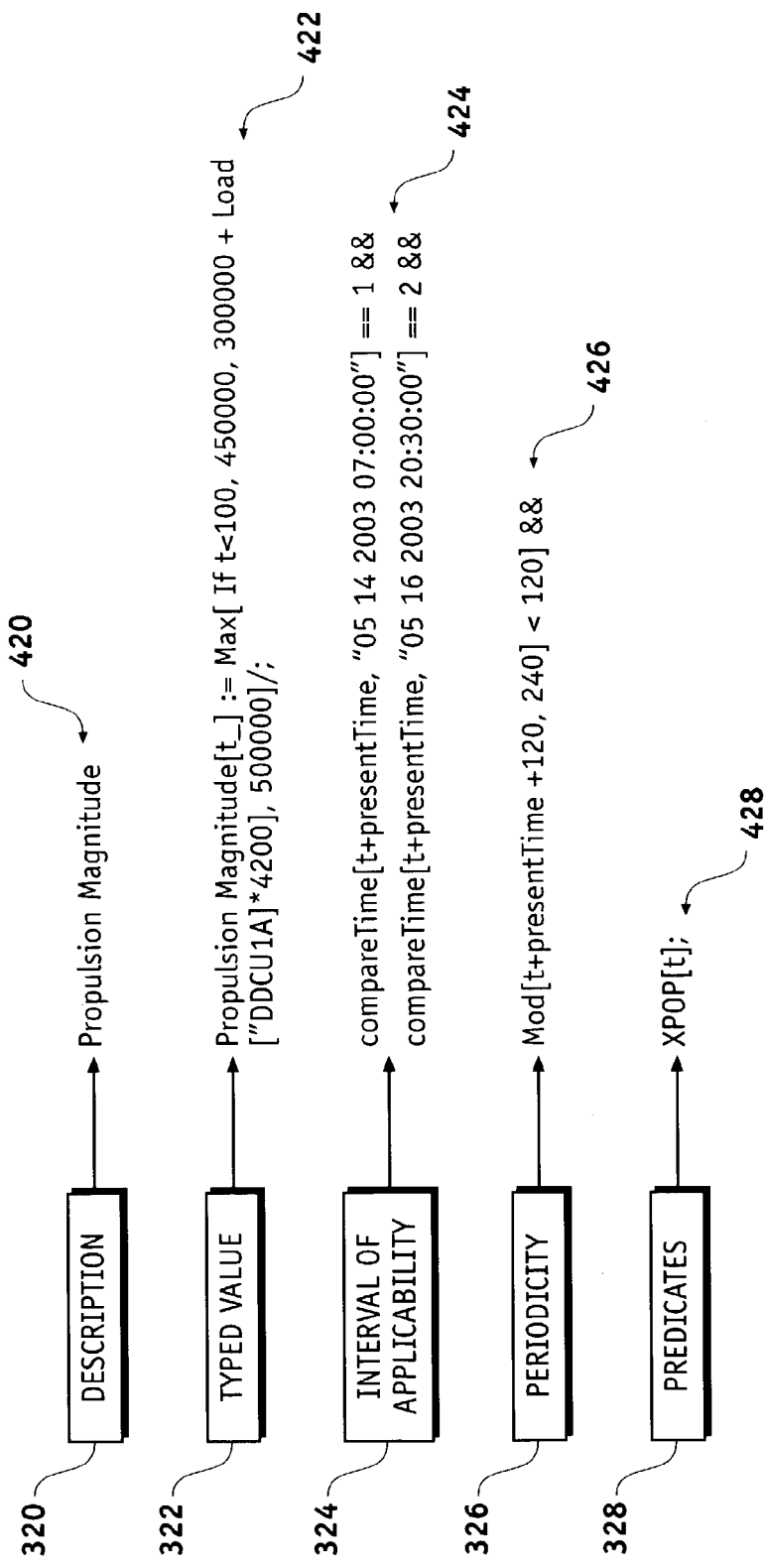
FIG. 4 illustrates autocoded executable statements describing human activities.

FIG. 4 shows an example of an autocoded executable plannable element 120. Description 320 may be a text string 420 which may not be autocoded. Typed value 322 may be entered originally in a GUI 134 context of a particular variable such as "Propulsion Magnitude." That context defines the variable or state vector element to be changed. In the example in FIG. 4, value expression 422 is to be stored in variable "Propulsion Magnitude[t_]." The interval of applicability 324 is shown by two "compareTime" statements 424 logically ANDed ("&&") with each other and with periodicity 326 autocoded segment 426. Autocoded periodicity segment 426 is true for 120 seconds and false for 120 seconds in a continuous cycle and is logically ANDed with predicate expression autocoded as "XPOP[t]" 428 which defines a particular spacecraft attitude. When the logical statements 422, 424, 426, and 428 are true, variable Propulsion Magnitude yields the value of expression 422. In this manner, a human activity plan to cycle a thruster 422 on and off periodically 426 when in a certain attitude 428 and within a particular time period 424 at a thrust expressed by expression 422 may be expressed mathematically and executably. A wide variety of plannable human activities may be expressed as executable plannable elements 120 by the method 200 disclosed herein, and the example given in FIG. 4 is not intended to be limiting.

Referring again to FIG. 2, the executable plannable elements 120 are then coupled 206 to the simulation core 125. Coupling 206 may include compiling the executable plannable elements 120 and the simulation core 125 together. In some embodiments coupling 206 may include storing the executable plannable elements 120 in a file that the simulation core 125 has been programmed to access. Those of ordinary skill in the art will appreciate additional methods of coupling coded modules 120 and 125.

In step 208, a code module 132 containing routines capable of calculating the effects of the laws of physics on the dynamic system may be coupled to the simulation core 125. In most embodiments, simulation core 125 will contain code module 132 by design, and step 208 may be skipped. In some embodiments, the code expressing the laws of physics may not be modular 132, but integral to the simulation core 125.

In step 210, a code module 124 containing routines capable of calculating equations of state for the dynamic system, its subsystems, boxes, and components may be coupled to the simulation core 125. In some embodiments, the code module for the equations of state 124 will be integral with the simulation core 125 by design, and step 210 may be skipped. In some embodiments, the routines capable of calculating equations of state may not be collected in a code module 124, but may be integral to the simulation core 125.

In step 212, the telemetry subsystem 112 may be coupled to the simulation core 125. The telemetry subsystem 112 supplies the data from which the initial system state vector may be determined for each prognostication. Any source of initial system state vector data may be substituted for telemetry subsystem 112. The coupling 212 may comprise connecting the telemetry subsystem 112 to a data interface on a bus 152 connected to the processor 158 and to the memory 156. In some embodiments, telemetry subsystem 112 will provide pre-processed system state vector elements to simulation core 125. In other embodiments, the simulation core 125 or a code module associated therewith may process raw telemetry into system state vector elements.

The coupling steps 206, 208, 210, and 212 complete the formation of an exemplary simulation. A minimal simulation of a dynamic system may be formed by steps 206 and 212 in embodiments wherein expressions relating to laws of physics are integral to the simulation core. With the simulation assembled, the simulation may be executed 214. Execution 214 may cause the simulation to produce simulated system state vector data for each time step of the simulation. The simulated system state vector data may be in the form of simulated telemetry.

Step 215 monitors the data produced by the simulation. In some embodiments, the monitoring step 215 may be integral to the execution step 214. The monitoring step produces planning conflict messages 170 (FIG. 1) which may be received in step 216 by a user. A planning conflict message 170 may be generated when an executable plannable element 120 requires a resource that is unavailable, when an undesirable condition has been simulated, or when the initial conditions of the current, or active, plan 302 (FIG. 3) do not match the initial conditions of the actual system as indicated by telemetry subsystem 112. The user may then change the mission plan to resolve conflicts 218 and begin process 200 again.

Step 218 may include having the simulation monitor 134 change the initial conditions in the active plan 302 to match the initial conditions of the actual system as indicated by the telemetry subsystem 112. In some embodiments, other executable code, such as the simulation core 125, simulation executive 130, or an IVHMS may implement the changes.

FIGS. 3 and 4 have been discussed above in connection with FIG. 1.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An apparatus for prognosticating system performance in a dynamic system influenced by planned human activities, said dynamic system having a state vector and a telemetry subsystem, the apparatus comprising:
   a processor coupled to said telemetry subsystem and configured to acquire data relating to said state vector from said telemetry subsystem;
   memory, coupled to said processor, having stored therein mission plan data, said mission plan data comprising at least one plannable element relating to said planned human activities, said at least one plannable element comprising a value having a type and an interval of applicability;
   a dynamic system simulation core residing in said memory and executable on said processor to form a dynamic system simulation incorporating said mission plan data and said state vector data;
   a mission planning graphical user interface (GUI) receiving mission plan data and displaying results related to the dynamic system simulation; and
   a simulation monitor configured to receive data produced by said dynamic system simulation and executable to produce data indicative of problematic behavior of said dynamic system, wherein said data indicative of problematic behavior comprises plan deviation responses.

2. The apparatus of claim 1, further comprising an executable expression of an effect of a law of physics upon said dynamic system, said expression residing in said memory and accessible by said simulation core.

3. The apparatus of claim 1, further comprising an executable equation of state for said dynamic system, said equation residing in said memory and accessible by said simulation core.

4. The apparatus of claim 1, wherein said mission planning GUI comprises code executable to autocode said mission plan data into executable plannable elements.

5. The apparatus of claim 4, wherein said executable plannable elements are adapted to be coupled to said system simulation core.

6. The apparatus of claim 5, further comprising code executable to sort said executable plannable elements by time of next execution.

7. The apparatus of claim 1, wherein said mission plan data includes at least one executable plannable element, said apparatus further comprising a simulation executive operable to define simulation time steps and further executable to call said at least one executable plannable element at each said simulation time step.

8. The apparatus of claim 7, wherein said simulation executive further comprises a cycle controller operable to periodically restart said system simulation to provide indications of behavior of said dynamic system for a predetermined minimum future period of time.

9. The apparatus of claim 7, wherein said dynamic system simulation comprises:
   code responsive to said telemetry subsystem to create an initial state vector of said dynamic system;
   code responsive to said at least one executable plannable element to simulate behaviors of said dynamic system for a predetermined future period of time; and
   code executable to produce data indicative of said behaviors.

10. The apparatus of claim 9, wherein said data indicative of said behaviors comprises simulated telemetry data.

11. The apparatus of claim 9, wherein said data indicative of said behaviors comprises planning conflict messages.

12. The apparatus of claim 1, wherein said data indicative of problematic behavior comprises planning conflict messages.

13. The apparatus of claim 12, wherein the simulation monitor is further configured to receive additional data indicative of resolution of the problematic behavior, said additional data comprising deconfliction messages.

14. The apparatus of claim 1, wherein the mission plan data comprises a nominal plan, a default plan, and a supplementary plan.

15. An apparatus for prognosticating system performance in a spacecraft electrical system influenced by planned human activities, said spacecraft electrical system having a state vector and a telemetry subsystem, the apparatus comprising:
   a processor coupled to said telemetry subsystem and configured to acquire data relating to said state vector from said telemetry subsystem;
   memory coupled to said processor having stored therein mission plan data, said mission plan data comprising at least one plannable element relating to said planned human activities, said at least one plannable element comprising a value having a type and an interval of applicability;
   a spacecraft electrical system simulation core stored in said memory and executable on said processor to form a spacecraft electrical system simulation incorporating said mission plan data and said state vector data;
   a mission planning graphical user interface (GUI) executable to receive mission plan data, said mission planning graphical user interface (GUI) displaying results related to the spacecraft electrical system simulation; and
   a simulation monitor configured to receive data produced by said spacecraft electrical system simulation core and operable to produce data indicative of problematic behavior of said spacecraft electrical system simulation core, wherein said data indicative of problematic behavior comprises plan deviation responses.

16. The apparatus of claim 15, said memory further storing executable expressions of effects of the laws of physics upon said spacecraft electrical system and executable equations of state for said spacecraft electrical system, said expressions and equations accessible by said simulation core.

17. The apparatus of claim 15, wherein said mission planning GUI is configured to access code executable to autocode said mission plan data into executable plannable elements.

18. The apparatus of claim 17, wherein said executable plannable elements are stored in said memory and are accessible to said system simulation core.

19. The apparatus of claim 18, further comprising code configured to sort said executable plannable elements by time of next execution.

20. The apparatus of claim 18, wherein said spacecraft electrical system simulation includes a simulation executive operable to define simulation time steps and further operable to call at least one executable plannable element at each said simulation time step.

21. The apparatus of claim 20, wherein said spacecraft electrical system simulation further comprises:
   code responsive to said telemetry subsystem to create an initial state vector of said spacecraft electrical system;
   code responsive to said executable plannable elements to simulate behaviors of said spacecraft electrical system for a predetermined future period of time; and code executable to produce data indicative of said behaviors.

22. The apparatus of claim 21, wherein said data indicative of said behaviors comprises simulated telemetry data.

23. The apparatus of claim 21, wherein said data indicative of said behaviors comprises planning conflict messages.

24. The apparatus of claim 20, wherein said spacecraft electrical system simulation executive further comprises a cycle controller operable to periodically restart said system simulation to continuously provide indications of problematic behavior for a predetermined minimum future period of time.

25. The apparatus of claim 15, wherein said data indicative of problematic behavior comprises planning conflict messages.

26. A method for prognosticating system performance in a dynamic system influenced by planned human activities using a simulation having an executable simulation core and simulation variables, the method comprising the steps of:
  parsing data relating to said planned human activities into mission data having a plurality of plannable elements;
  autocoding each plannable element of said plurality of plannable elements into an executable plannable element; and
  coupling each said executable plannable element to said executable simulation core;
  coupling a telemetry subsystem to said simulation core and extracting a state vector of said dynamic system from said telemetry subsystem, said state vector having elements;
  identifying a planning conflict comprising identifying a difference between a value of an element of an initial state vector of said dynamic system and an initial value of a simulation variable representing said element; and
  displaying said planning conflict and at least one plan deviation response.

27. The method of claim 26, further comprising the step of entering mission plan data through a user interface adapted to restrict data input to data suitable for said autocoding.

28. The method of claim 26, further comprising the step of changing the initial value of said simulation variable to match the value of said element of the initial state vector.

29. The method of claim 26, further comprising the step of executing said simulation to simulate said system performance for a predetermined future period of time.

30. The method of claim 29, further comprising the step of monitoring data produced by the step of executing said simulation.

31. The method of claim 30, further comprising the step of identifying a resource conflict among different subsystem plans.

32. The method of claim 30, further comprising the step of identifying a time of termination of a resource conflict.

33. The method of claim 30, wherein the step of identifying a planning conflict comprises identifying an undesirable condition.

34. The method of claim 26, further comprising the step of coupling an executable expression relating to an equation of state to said simulation core.

35. The method of claim 26, further comprising the step of coupling an executable expression relating to a law of physics to said simulation core.

36. A computer readable media on which is recorded executable instructions for prognosticating system performance for a dynamic system influenced by planned human activities expressed as mission plan data, the dynamic system having a state vector and a telemetry subsystem, the executable instructions when executed by a processor performing the steps comprising:
  translating telemetry data from said telemetry subsystem into said state vector;
  forming a dynamic system simulation incorporating said mission plan data and said state vector, said mission plan data including at least one plannable element related to said planned human activities and having a type,
  said forming step including
    converting said at least one plannable element into at least one executable plannable element; and
    sorting said at least one executable plannable element by time of next execution;
  performing said dynamic system simulation to produce data;
  receiving said data from said dynamic system simulation and generating planning conflict messages and plan deviation responses from said data; and
  storing said planning conflict messages.

37. The computer readable media of claim 36, wherein the steps further comprise receiving said mission plan data.

38. The computer readable media of claim 37, wherein the mission plan data receiving step includes receiving said mission plan data with a graphical user interface.

39. The computer readable media of claim 36, wherein the steps further comprise executing at least one executable expression of a law of physics affecting said dynamic system, said at least one executable expression accessible to a simulation core.

40. The computer readable media of claim 36, wherein the steps further comprise executing at least one executable expression of an equation of state of said dynamic system, said at least one executable expression accessible to a simulation core.

* * * * *